United States Patent
Song et al.

(10) Patent No.: US 8,941,425 B2
(45) Date of Patent: Jan. 27, 2015

(54) SEMICONDUCTOR DEVICE COMPENSATING FOR INTERNAL SKEW AND OPERATING METHOD THEREOF

(71) Applicant: Samsung Electronics Co., Ltd., Suwon-si (KR)

(72) Inventors: Ho-Bin Song, Daejeon (KR); Tae-Pyeong Kim, Seongnam-si (KR); Cheon-Oh Lee, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/136,582

(22) Filed: Dec. 20, 2013

(65) Prior Publication Data

US 2014/0191788 A1    Jul. 10, 2014

(30) Foreign Application Priority Data

Jan. 9, 2013   (KR) .......................... 10-2013-0002533

(51) Int. Cl.
*H03L 7/00* (2006.01)
*H03K 5/153* (2006.01)

(52) U.S. Cl.
CPC ...................................... *H03K 5/153* (2013.01)
USPC ........................................... 327/161; 327/261

(58) Field of Classification Search
USPC ................................................. 327/161, 261
See application file for complete search history.

(56) References Cited

U.S. PATENT DOCUMENTS

| | | | |
|---|---|---|---|
| 5,291,070 A * | 3/1994 | Witt .............................. | 327/141 |
| 7,143,303 B2 | 11/2006 | Sohn et al. | |
| 7,282,974 B2 * | 10/2007 | Lee ............................... | 327/158 |
| 7,671,579 B1 | 3/2010 | Chong et al. | |
| 7,746,142 B2 | 6/2010 | Changchein et al. | |
| 7,835,469 B2 | 11/2010 | Pessa | |
| 7,990,183 B2 | 8/2011 | Kojima | |
| 8,269,528 B2 | 9/2012 | Payne et al. | |
| 2010/0315142 A1* | 12/2010 | Zerbe ............................ | 327/161 |
| 2011/0221497 A1 | 9/2011 | Chong et al. | |
| 2012/0044004 A1* | 2/2012 | Payne et al. .................... | 327/161 |
| 2012/0126869 A1* | 5/2012 | Payne et al. .................... | 327/161 |
| 2012/0194241 A1* | 8/2012 | Shin .............................. | 327/158 |
| 2013/0229211 A1* | 9/2013 | Nishiyama et al. ........... | 327/146 |
| 2013/0249612 A1* | 9/2013 | Zerbe et al. ................... | 327/161 |
| 2014/0191788 A1* | 7/2014 | Song et al. .................... | 327/161 |
| 2014/0204691 A1* | 7/2014 | Canac et al. .................. | 365/194 |

* cited by examiner

*Primary Examiner* — Adam Houston
(74) *Attorney, Agent, or Firm* — Sughrue Mion, PLLC

(57) ABSTRACT

Provided is a semiconductor device for compensating for an internal skew without training with an external device. The semiconductor device includes a signal generating unit configured to generate and output a reference signal, a first receiving unit configured to receive the reference signal and output a first output signal, a second receiving unit configured to receive the reference signal and output a second output signal, a delay unit configured to delay the first output signal by a certain time and output a delayed signal, a sampling unit configured to sample the second output signal based on the delayed signal and output sampling data, and a skew controlling unit configured to control the delaying unit based on the sampling data.

19 Claims, 6 Drawing Sheets

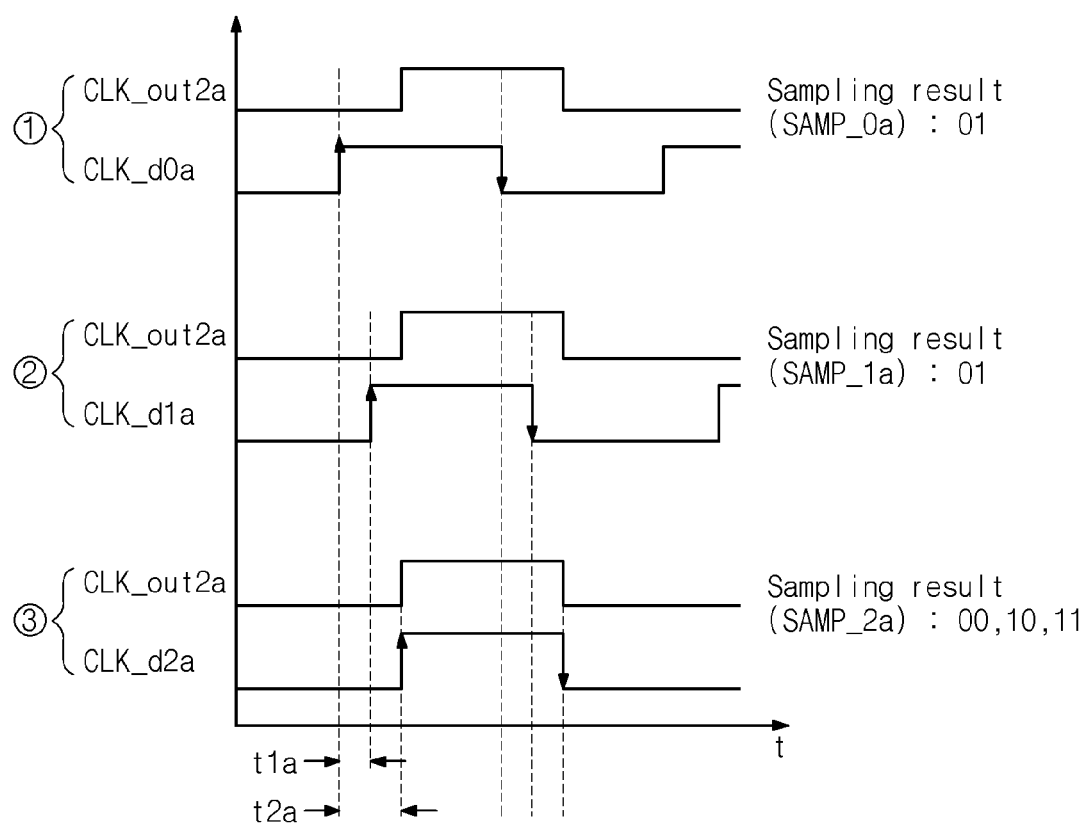

SEMICONDUCTOR DEVICE COMPENSATING FOR INTERNAL SKEW AND OPERATING METHOD THEREOF

CROSS-REFERENCE TO RELATED APPLICATIONS

This application claims priority from Korean Patent Application No. 10-2013-0002533, filed on Jan. 9, 2013, the entire disclosure of which is incorporated herein by reference.

TECHNICAL FIELD

Apparatuses and methods consistent with exemplary embodiments relate to a semiconductor device compensating for an internal skew and a method for operating the same.

DISCUSSION OF THE RELATED ART

With development of semiconductor technology, not only an operation speed of a semiconductor device but also a transmission speed between semiconductor devices has been improved. A clock synchronous system that operates based on a synchronous clock (CLK_s) is used to maximize inter-operation performance between semiconductor devices. The clock synchronous system represents a system in which devices operate based on the same clock. When a skew between a clock signal and a data signal occurs in the clock synchronous system, a setup/hold margin of data decreases. Therefore, the system may not correctly operate or may not operate with maximal performance.

Semiconductor devices are designed to minimize a skew between signals. However, due to a process variation, a wiring mismatch, or a device mismatch, a skew between a data signal and a clock signal occurs in a semiconductor device. In order to overcome this limitation, the semiconductor device and transmitting device included in the clock synchronous system previously perform a training operation based on a predetermined signal. The semiconductor device and the transmitting device may compensate for the skew between the data signal and the clock signal through this training operation. However, an additional device such as a phase locked loop (PLL) is necessary to adjust frequencies of signals used for the training operation. Therefore, the time and cost for compensating for the skew between the data signal and the clock signal increase.

SUMMARY

One or more exemplary embodiments provide a semiconductor device for compensating for an internal skew without training with an external device, and a skew compensating method thereof.

According to an aspect of an exemplary embodiment, there is provided a semiconductor device which may include a signal generating unit configured to generate and output a reference signal, a first receiving unit configured to receive the reference signal and output a first output signal, a second receiving unit configured to receive the reference signal and output a second output signal, a delay unit configured to delay the first output signal by a certain time and output a delayed signal, a sampling unit configured to sample the second output signal based on the delayed signal and output sampling data, and a skew controlling unit configured to control the delaying unit based on the sampling data.

The semiconductor device may further include first and second multiplexers configured to receive the reference signal from the signal generating unit, and receive a synchronous clock and data from an external device, respectively.

The first multiplexer may transmit one of the received reference signal and synchronous clock to the first receiving unit, and the second multiplexer may transmit one of the received reference signal and data to the second receiving unit.

The reference signal may have at least one of the same frequency, phase, and duty cycle as a synchronous signal for the semiconductor device.

The skew controlling unit may store a delay characteristic of the delaying unit based on the sampling data.

The skew controlling unit may control the delaying unit based on the stored delay characteristic.

The sampling unit may generate first sampling data by sampling the second output signal based on the first output signal and generate second sampling data by sampling the second output signal based on the delayed signal, and the skew controlling unit may compare the first and second sampling data, and control the delaying unit based on a result of the comparison.

When the first and second sampling data are the same, the skew controlling unit may control the delaying unit such that a delay time of the delayed signal is adjusted by a certain time.

When the first and second sampling data are different from each other, the skew controlling unit may control the delaying unit to have a delay time characteristic of the delayed signal.

The sampling unit may sample the second output signal a plurality of times based on the delayed signal, and output the sampling data based on an average value of results of the sampling performed the plurality of times.

According to an aspect of another exemplary embodiment, there is provided a method for compensating for an internal skew of a semiconductor device having first and second receiving units and operating based on a synchronous clock, the method including generating a reference signal, transmitting the reference signal to the first and second receiving units to generate first and second output signals, generating first sampling data by sampling the second output signal based on the first output signal, generating a delayed signal by delaying the first output signal by a delay time, generating second sampling data by sampling the second output signal based on the delayed signal, comparing the first and second sampling data, and determining a delay time of a delay unit according to a result of the comparing.

The generating of the first sampling data may include generating the first sampling data by sampling the second output signal at at least one of a rising edge and a falling edge of the first output signal, and the generating the second sampling data may include generating the second sampling data by sampling the second output signal at at least one of a rising edge and a falling edge of the delayed signal.

The determining the delay time may include adjusting the delay time when the first and second sampling data are the same according to a result of the comparing.

The determining the delay time may include storing the delay time when the first and second sampling data are different from each other according to a result of the comparing.

The method may further include controlling the delay unit based on the stored delay time.

BRIEF DESCRIPTION OF THE DRAWINGS

The above and other aspects will become more apparent by describing in detail exemplary embodiments with reference to the accompanying drawings, in which:

FIGS. 3A and 3B are diagrams for specifically describing an operation of the semiconductor device according to exemplary embodiments;

DETAILED DESCRIPTION OF THE EXEMPLARY EMBODIMENTS

Figure 1:
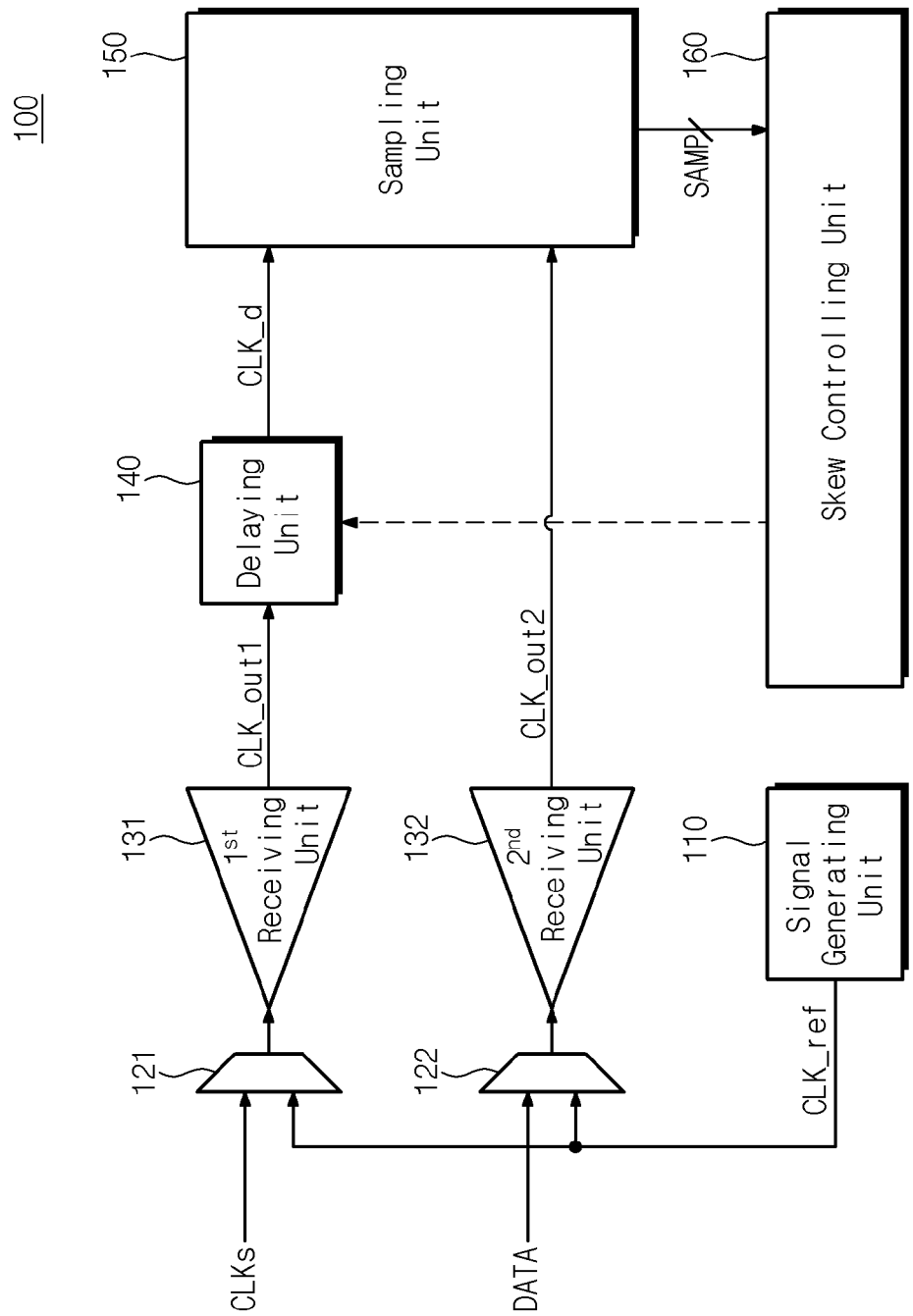
FIG. 1 is a block diagram illustrating a semiconductor device according to an exemplary embodiment.

Exemplary embodiments will be described more fully hereinafter with reference to the accompanying drawings. Like reference numerals may refer to like elements throughout the accompanying drawings.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

A semiconductor device according to an exemplary embodiment of the inventive concept may compensate for an internal skew by using the same signals without training with an external device. The internal skew indicates a phase difference between a clock signal and a data signal which occurs due to a process variation, a wiring mismatch, a device mismatch or so on.

FIG. 1 is a block diagram illustrating a semiconductor device 100 according to an exemplary embodiment of the inventive concept. Referring to FIG. 1, the semiconductor device 100 includes a signal generating unit 110, first and second multiplexers (MUXs) 121 and 122, a first receiving unit 131, a second receiving unit 132, a delaying unit 140, a sampling unit 150, and a skew controlling unit 160. The semiconductor device 100 may be a clock synchronous system. The clock synchronous system represents a system in which devices operate based on synchronized synchronous clocks. That is, the devices included in the clock synchronous system operate based on the same synchronous clocks (for example, clocks having the same phase, frequency and/or duty cycle). The semiconductor device 100 may receive data DATA and a synchronous clock CLK_s from an external device. The semiconductor device 100 may include devices that operate based on semiconductor elements, such as semiconductor memory devices and semiconductor logic circuit. For example, the first receiving unit 131 and the second receiving unit 132 may be two different memory devices, two different logic circuits, or a memory device and a logic circuit having semiconductors.

The signal generating unit 110 may generate a reference signal CLK_ref. The reference signal CLK_ref may be determined by the synchronous clock CLK_s of the semiconductor device 100. For example, because the semiconductor device 100 is included in the clock synchronous system, the semiconductor device 100 operates based on the synchronous clock CLK_s which is the same as that of an external device. A frequency, a phase and/or a duty cycle of the reference signal CLK_ref may be the same as those of the synchronous clock CLK_s. The reference signal CLK_ref may be transmitted to the first and second multiplexers 121 and 122.

The first and second multiplexers 121 and 122 may receive the reference signal CLK_ref from the signal generating unit 110. The first and second multiplexers 121 and 122 may respectively receive the data DATA and the synchronous clock CLK_s from the external device. The first multiplexer 121 may select and output one of the received reference signal CLK_ref and the synchronous clock CLK_s, and the second multiplexer 122 may select and output one of the received reference signal CLK_ref and the data DATA. The first and second multiplexers 121 and 122 may output the reference signal CLK_ref to compensate for an internal skew of the semiconductor device 100.

The first and second receiving units 131 and 132 may receive the synchronous clock CLK_s and the data DATA from the multiplexers 121 and 122, respectively. For example, the first receiving unit 131 may receive the synchronous clock CLK_s from the first multiplexer 121. The synchronous clock CLK_s indicates an operating clock of the semiconductor device 100 provided from the external device. The semiconductor device 100 may operate based on the synchronous clock CLK_s. The second receiving unit 132 may receive the data DATA from the second multiplexer 122.

The first and second receiving units 131 and 132 may have different delay characteristics. For example, in a case where the reference signal CLK_ref is input to the first and second receiving units 131 and 132, first and second output signals CLK_out1 and CLK_out2 output from the first and second receiving units 131 and 132 should be the same signal or have the same frequency, phase and/or duty cycle. However, due to a process variation, a wiring mismatch, or a device mismatch of the first and second receiving units 121 and 122, the first and second output signals CLK_out1 and CLK_out2 may have different frequencies, phases and/or duty cycles. Therefore, an internal skew of the semiconductor device 100 occurs. To compensate for this internal skew, the first and second receiving units 131 and 132 may receive the reference signal CLK_ref from the first and second multiplexers 121 and 122, according to an exemplary embodiment.

The delaying unit 140 may delay the first output signal CLK_out1 output from the first receiving unit 131 by a certain time. For example, the delaying unit 140 may delay the first output signal CLK_out1 by a certain time according to control of the skew controlling unit 160 to output a delayed signal CLK_d. According to an exemplary embodiment, the delaying unit 140 may sequentially increase a delay time of the delayed signal CLK_d according to the control of the skew controlling unit 160.

The sampling unit 150 may receive the second output signal CLK_out2 from the second receiving unit 132 and the delayed signal CLK_d output from the delaying unit 140. The sampling unit 150 may sample the second output signal CLK_out2 based on the received delayed signal CLK_d. For example, the sampling unit 150 may sample the second output signal CLK_out2 at a rising edge or a falling edge of the delayed signal CLK_d. The sampling unit 150 may transmit sampling data SAMP to the skew controlling unit 160.

According to an exemplary embodiment, when a phase of the delayed signal CLK_d is substantially the same as that of the second output signal CLK_out2 (when there is no internal skew), the sampling value of the second output signal CLK_out2 at a rising edge or a falling edge of the delayed signal CLK_d may be a logic high or logic low value. That is, when the phase of the delayed signal CLK_d is substantially the same as that of the second output signal CLK_out2 (when there is no internal skew), the sampling data SAMP may not have a constant value. In this case, since the sampling data of the sampling unit 150 are not constant, the sampling unit 150 may sample the second output signal CLK_out2 n number of times, n being a natural number greater than or equal to 1. The sampling unit 150 may determine the sampling data SAMP based on sampling values obtained through the sampling performed n number of times.

The skew controlling unit 160 may control the delaying unit 140 based on the sampling data SAMP received from the sampling unit 150. For example, when the phase of the second output signal CLK_out2 lags the phase of the delayed signal CLK_d by a certain time, the received sampling data SAMP may be '01'. In this case, the skew controlling unit 160 may control the delaying unit 140 to output a delay signal having a phase that leads the phase of the delayed signal CLK_d. An operation of the skew controlling unit 160 will be described in more detail with reference to FIG. 3.

To summarize an operation of the semiconductor device 100, the semiconductor device 100 may compensate for an internal skew by using the reference signal CLK_ref without training with the external device. For example, the signal generating unit 110 of the semiconductor device 100 generates the reference signal CLK_ref. The generated reference signal CLK_ref is transmitted to the first and second multiplexers 121 and 122. The first and second multiplexers 121 and 122 transmit the received reference signal CLK_ref to the first and second receiving units 131 and 132. The first and second receiving units 131 and 132 have different delay characteristics. That is, the first and second receiving units 131 and 132 receive the reference signal CLK_ref, and output the first and second output signals CLK_out1 and CLK_out2 having different phases. The delaying unit 140 delays the first output signal CLK_out1 by a certain time and outputs the delayed signal CLK_d. The sampling unit 150 samples the second output signal CLK_out2 based on the delayed signal CLK_d. The sampling unit 150 transmits the sampled data SAMP to the skew controlling unit 160. The skew controlling unit 160 adjusts a delay time of the delayed signal CLK_d based on the received sampled data SAMP. An operation of the skew controlling unit 160 will be described in more detail with reference to FIG. 3.

Figure 2:
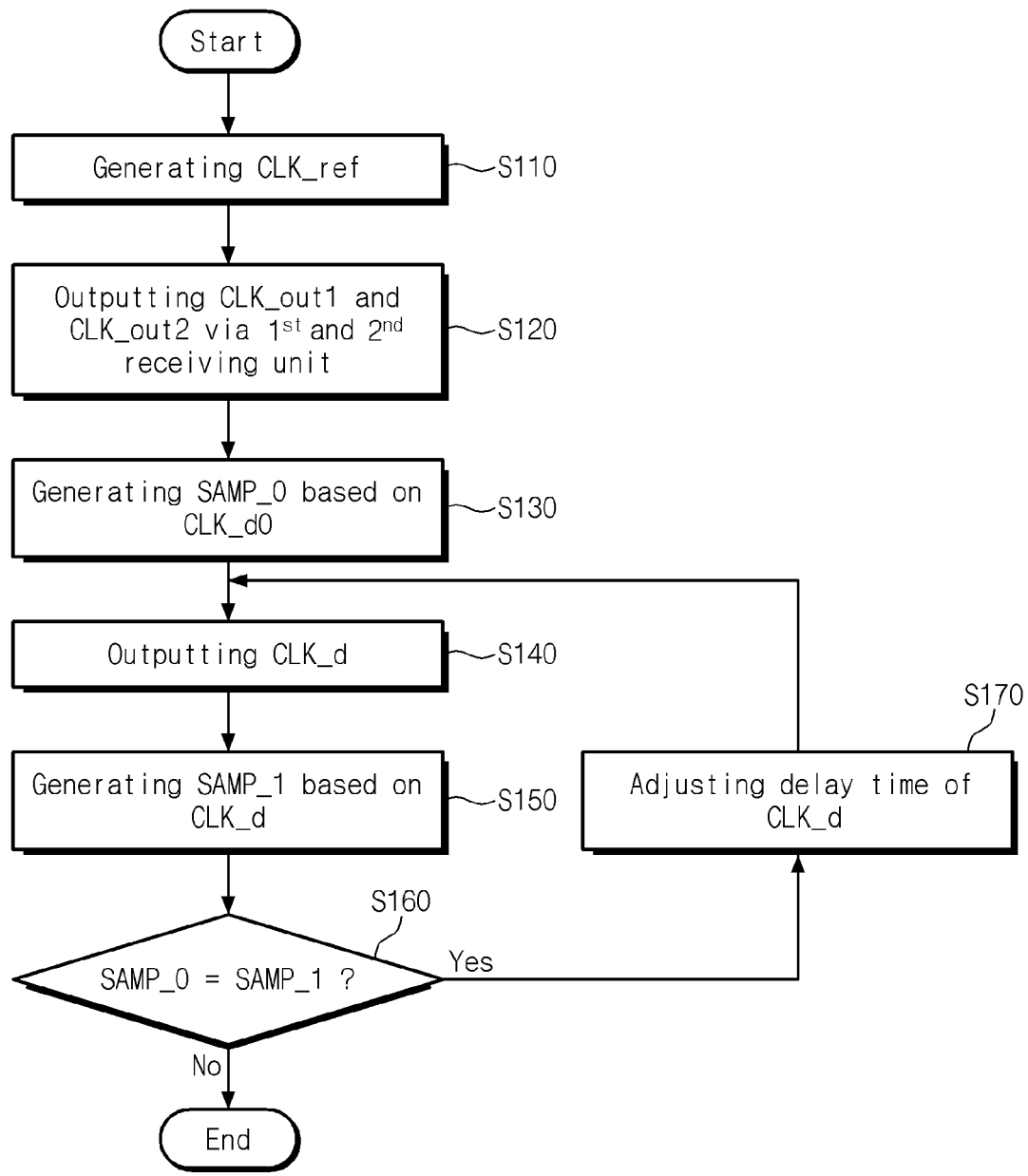
FIG. 2 is a flowchart illustrating an operation of the semiconductor device according to an exemplary embodiment.

FIG. 2 is a flowchart illustrating an operation of the semiconductor device 100 according to an exemplary embodiment of the inventive concept. Referring to FIG. 2, in operation S110, the semiconductor device 100 generates the reference signal CLK_ref. The reference signal CLK_ref may have the same phase, frequency and/or duty cycle as the synchronous clock CLK_s of the semiconductor device 100.

In operation S120, the first and second receiving units 131 and 132 included in the semiconductor device 100 output the first and second output signals CLK_out1 and CLK_out2, respectively. For example, the first and second receiving units 131 and 132 may receive the reference signal CLK_ref to output the first and second output signals CLK_out1 and CLK_out2, respectively. The first and second output signals CLK_out1 and CLK_out2 have different phases due to a difference between the delay characteristics of the first and second receiving units 131 and 132.

In operation S130, the semiconductor device 100 may generate a 0th sampling data SAMP_0 by sampling the second output signal CLK_out2 based on a 0th delayed signal CLK_d0. The 0th delayed signal CLK_d0 represents the first output signal CLK_out1 which is not delayed. For example, the semiconductor device 100 may sample the second output signal CLK_out2 at a rising edge and/or a falling edge of the 0th delayed signal CLK_d0. In this case, when the phase of the second output signal CLK_out2 lags the phase of the 0th delayed signal CLK_d0, the 0th sampling data SAMP_0 may have a value of '01'. On the contrary, when the phase of the second output signal CLK_out2 leads the phase of the 0th delayed signal CLK_d0, the 0th sampling data SAMP_0 may have a value of '10'. The generated 0th sampling data SAMP_0 may be transmitted to the skew controlling unit 160.

In operation S140, the delaying unit 140 included in the semiconductor device 100 outputs the delayed signal CLK_d. For example, the delaying unit 140 may output the delayed signal CLK_d by delaying (or advancing) the first output signal CLK_out1 by a certain time according to the control of the skew controlling unit 160.

In operation S150, the semiconductor device 100 samples the second output signal CLK_out2 based on the delayed signal CLK_d to thereby generate a first sampling data SAMP_1. For example, the semiconductor device 100 may sample the second output signal CLK_out2 at a rising edge and/or a falling edge of the delayed signal CLK_d.

In operation S160, the semiconductor device 100 may determine whether the 0th and first sampling data SAMP_0 and SAMP_1 are the same.

According to a result of the determination, when the 0th and first sampling data SAMP_0 and SAMP_1 are the same, the semiconductor device 100 adjusts a delay time of the delayed signal CLK_d. For example, when both the 0th and first sampling data SAMP_0 and SAMP_1 have a value of '01', the semiconductor device 100 may adjust the delay time of the delayed signal CLK_d to advance the phase of the delayed signal CLK_d. Operation S170 will be described in more detail with reference to FIG. 3.

According to the result of the determination, when the 0th and first sampling data SAMP_0 and SAMP_1 are different from each other, the semiconductor device 100 finishes an operation. For example, when the 0th and first sampling data SAMP_0 and SAMP_1 are different from each other, the semiconductor device 100 may store delay time information on the delayed signal CLK_d. The semiconductor device 100 may delay the first output signal CLK_out1 based on the stored delay time information.

Figure 3B:
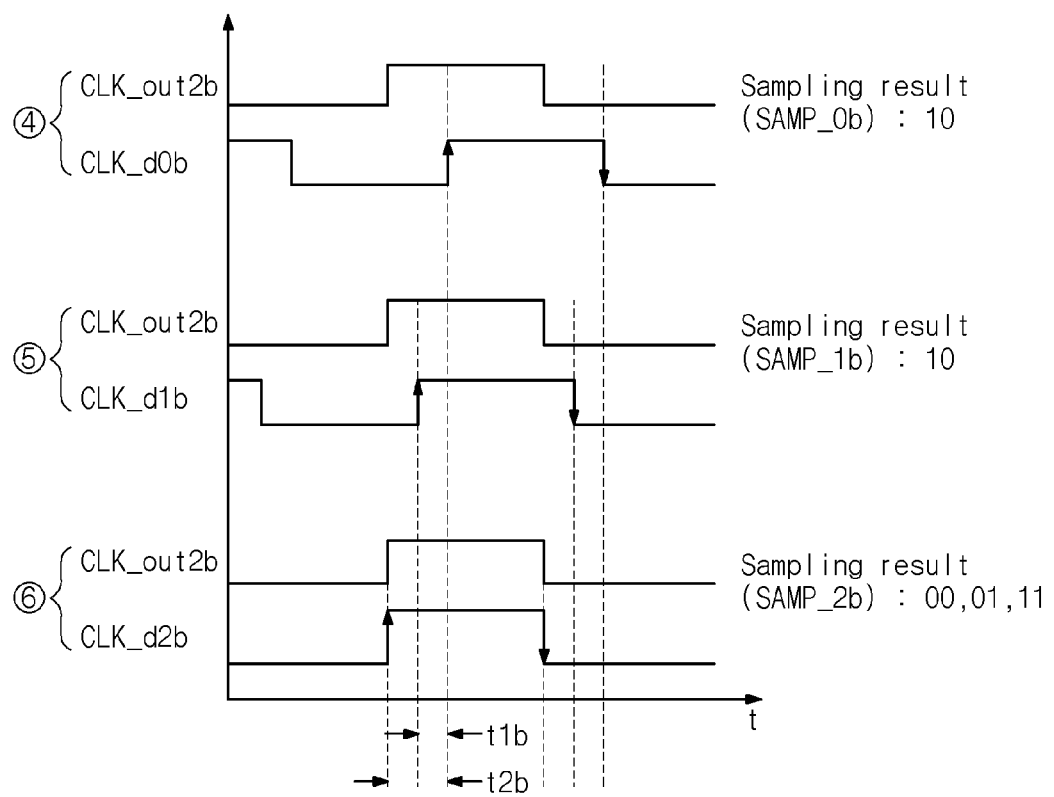

FIGS. 3A and 3B are diagrams for specifically describing an operation of the semiconductor device 100 according to an exemplary embodiment of the inventive concept. As described above, the sampling unit 150 samples the second output signal CLK_out2 at a rising edge and/or a falling edge of the delayed signal CLK_d. According to an exemplary embodiment, the sampling unit 150 may sample the second output signal CLK_out2 by n number of times at a rising edge and/or a falling edge of the first output signal CLK_out1 or a first delayed signal CLK_d1a.

Referring to FIGS. 1 and 3A, in a first case (①), a phase of a 0th delayed signal CLK_d0a leads a phase of the second output signal CLK_out2a. The sampling unit 150 samples the second output signal CLK_out2a based on the 0th delayed signal CLK_d0a. For example, the sampling unit 150 samples the second output signal CLK_out2a at a rising edge and a falling edge of the 0th delayed signal CLK_d0a. The second output signal CLK_out2a has a logic low value at the rising edge of the 0th delayed signal CLK_d0a. The second output signal CLK_out2a has a logic high value at the falling edge of the 0th delayed signal CLK_d0a. That is, the 0th sampling data SAMP_0a may be '01'. The skew controlling unit 160 may receive the 0th sampling data SAMP_0a.

Next, in a second case (②), the skew controlling unit 160 controls, in response to the 0th sampling data SMAP_0a, the delaying unit 140 such that the 0th delayed signal CLK_d0a is delayed by a first time t1a and output as the first delayed signal CLK_d1a. According to the control of the skew controlling unit 160, the delaying unit 140 delays the 0th delayed signal CLK_d0a by the first time t1a and outputs the first delayed signal CLK_d1a. The first delayed signal CLK_d1a has a phase that lags the phase of the 0th output signal CLK_out0a.

The sampling unit 150 may generate the first sampling data SAMP_1a by sampling the second output signal CLK_out2a based on the first delayed signal CLK_d1a. For example, the sampling unit 150 may sample the second output signal CLK_out2a at a rising edge and a falling edge of the first delayed signal CLK_d1a. The second output signal CLK_out2a has a logic low value at the rising edge period of the first delayed signal CLK_d1a, and has a logic high value at the falling edge period of the first delayed signal CLK_d1a. That is, the first sampling data SAMP_1a may be '01'. The skew controlling unit 160 may receive the first sampling data SAMP_1a.

Next, in a third case (③), the skew controlling unit 160 may compare the 0th and first sampling data SAMP_0a and SAMP_1a, and determine that the 0th and first sampling data SAMP_0a and SAMP_1a are the same. In this case, the skew controlling unit 160 controls the delaying unit 140 so that the 0th delayed signal CLK_d0a is delayed by a second time t2a. According to the control of the skew controlling unit 160, the delaying unit 140 delays the 0th delayed signal CLK_d0a by the second time t2a and outputs a second delayed signal CLK_d2a. The second time t2a is longer than the first time t1a. That is, a phase of the second delayed signal CLK_d2a lags the phase of the first delayed signal CLK_d1a. According to an exemplary embodiment, the skew controlling unit 160 may sequentially increase the delay time of the delaying unit 140 in response to the sampling data of the sampling unit 150.

The sampling unit 150 may sample the second output signal CLK_out2a based on the second delayed signal CLK_d2a. For example, the sampling unit 150 may sample the second output signal CLK_out2a at a rising edge and a falling edge of the second delayed signal CLK_d2a. According to an exemplary embodiment, the second delayed signal CLK_d2a and the second output signal CLK_out2a may substantially have the same phase. In this case, second sampling data SAMP_2a may be '00', '10' or '11'. The skew controlling unit 160 may receive the second sampling data SAMP_2a.

In the third case, the skew controlling unit 160 determines that the internal skew is compensated for. The skew controlling unit 160 may store the delay time (e.g., the second delay time t2a) of the second delayed signal CLK_d2a corresponding to the second sampling data SAMP_2a. The skew controlling unit 160 may control the delaying unit 140 based on the stored second delay time t2a. Accordingly, signals input to the delaying unit 140 are delayed by the second delay time t2a stored in the skew controlling unit 160 to thereby compensate for the internal skew.

Referring to FIGS. 1 and 3B, the phase of the second output signal CLK_out2b leads the phase of the 0th delayed signal CLK_d0b. In a fourth case (④), the sampling unit 150 samples the second output signal CLK_out2b based on the 0th delayed signal CLK_d0b. For example, the sampling unit 150 samples the second output signal CLK_out2b at a rising edge and a falling edge of the 0th delayed signal CLK_d0b. The second output signal CLK_out2 has a logic high value at the rising edge of the 0th delayed signal CLK_d0b. The second output signal CLK_out2 has a logic low value at the falling edge of the 0th delayed signal CLK_d0b. That is, the 0th sampling data SAMP_0b may be '10'. The skew controlling unit 160 may receive the 0th sampling data SAMP_0b.

Next, in a fifth case (⑤0), the skew controlling unit 160 controls, in response to the 0th sampling data SAMP_0b, the delaying unit 140 such that the 0th delayed signal CLK_d0b is led by a first time t1b and output as the first delayed signal CLK_d1b. According to the control by the skew controlling unit 160, the delaying unit 140 advances the 0th delayed signal CLK_d0b by the first time t1b to output the first delayed signal CLK_d1b. The phase of the first delayed signal CLK_d1b leads the phase of the first output signal CLK_out1b.

The sampling unit 150 may generate the first sampling data SAMP_1b by sampling the second output signal CLK_out2b based on the first delayed signal CLK_d1b. For example, the sampling unit 150 may sample the second output signal CLK_out2b at a rising edge and a falling edge of the first delayed signal CLK_d1b. The second output signal CLK_out2b has a logic high value at the rising edge period of the first delayed signal CLK_d1b, and has a logic low value at the falling edge period of the first delayed signal CLK_d1b. That is, the first sampling data SAMP_1b may be '10'. The skew controlling unit 160 may receive the first sampling data SAMP_1b.

Next, in a sixth case (⑥), the skew controlling unit 160 may compare the 0th and first sampling data SAMP_0b and SAMP_1b, and determine that the 0th and first sampling data SAMP_0 and SAMP_1b are the same. In this case, the skew controlling unit 160 controls the delaying unit 140 so that the 0th delayed signal CLK_d0b is advanced by a second time t2b. According to the control of the skew controlling unit 160, the delaying unit 140 advances the 0th delayed signal CLK_d0b by the second time t2b and outputs the second delayed signal CLK_d2b. The second time t2b is longer than the first time t1b. That is, the phase of the second delayed signal CLK_d2b leads the phase of the first delayed signal CLK_d1b. According to an exemplary embodiment, the skew controlling unit 160 may sequentially increase the lead time of the delaying unit 140 in response to the sampling data of the sampling unit 150.

The sampling unit 150 may sample the second output signal CLK_out2b based on the second delayed signal CLK_d2b. For example, the sampling unit 150 may sample the second output signal CLK_out2b at a rising edge and a falling edge of the second delayed signal CLK_d2b. According to an exemplary embodiment, the second delayed signal CLK_d2b and the second output signal CLK_out2b may substantially have the same phase. In this case, the second sampling data SAMP_2b may be '00', '10' or '11'. The skew controlling unit 160 may receive the second sampling data SAMP_2b.

In the sixth case (⑥), the skew controlling unit 160 determines that the internal skew is compensated for. The skew controlling unit 160 may store the delay time (e.g., the second delay time t2b) of the second delayed signal CLK_d2b corresponding to the second sampling data SAMP_2b. The skew controlling unit 160 may control the delaying unit 140 based on the stored second time t2b. Therefore, signals input to the delaying unit 140 are advanced by the second time t2b stored in the skew controlling unit 160 to thereby compensate for the internal skew.

As described above with reference to FIGS. 1, 3A and 3B, the semiconductor device according to an exemplary embodiment may compensate for the internal skew without training with an external device by advancing or delaying input signals using the same signal. Therefore, the semiconductor device may have improved performance and reliability.

Figure 4:
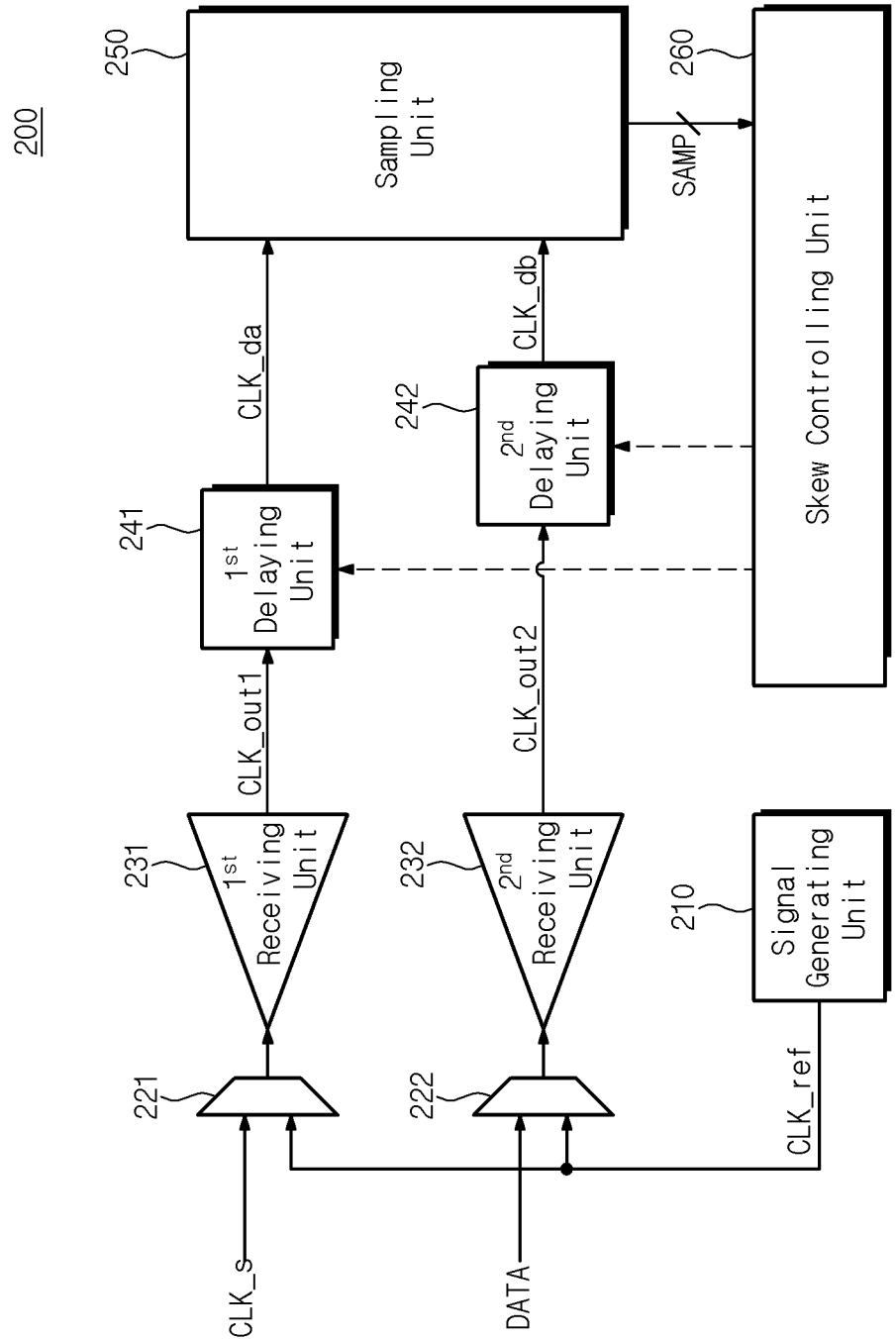
FIG. 4 is a block diagram illustrating a semiconductor device according to another exemplary embodiment.

FIG. 4 is a block diagram illustrating a semiconductor device according to another exemplary embodiment of the inventive concept. Referring to FIG. 4, the semiconductor device 200 includes a signal generating unit 210, first and second multiplexers 221 and 222, first and second receiving units 231 and 232, first and second delaying units 241 and 242, a sampling unit 250, and a skew controlling unit 260. The signal generating unit 210, the first and second multiplexers 221 and 222, the first and second receiving units 231 and 232, and the sampling unit 250 illustrated in FIG. 4 are the same as those illustrated in FIG. 1, and thus, descriptions of these elements are omitted. The semiconductor device 200 is described below with a focus on a difference between the semiconductor device 200 and the semiconductor device 100 of FIG. 1.

The first and second delaying units 241 and 242 respectively receive the first and second output signals CLK_out1 and CLK_out2. The first and second delaying units 241 and 242 may delay the received first and second output signals CLK_out1 and CLK_out2 by a certain time. For example, the first delaying unit 241 may delay the first output signal CLK_out1 by a certain time to output a first delayed signal CLK_da. The second delaying unit 242 may delay the second output signal CLK_out2 to output a second delayed signal CLK_db.

The sampling unit 250 receives the first and second delayed signals CLK_da and CLK_db output from the first and second delaying units 241 and 242, and may generate sampling data SAMP based on the operation described above with reference to FIGS. 3A and 3B. The generated sampling data SAMP is transmitted to the skew controlling unit 260.

The skew controlling unit 260 controls the first and second delaying units 241 and 242 based on the sampling data SAMP. For example, when a phase of the first delayed signal CLK_da leads a phase of the second delayed signal CLK_db, the received sampling data may be '01'. In this case, the skew controlling unit 260 may control the first and second delaying units 241 and 242 to delay the second delayed signal CLK_db or advance the first delayed signal CLK_da.

On the contrary, when the phase of the first delayed signal CLK_da lags the phase of the second delayed signal CLK_db, the received sampling data SAMP may be '10'. In this case, the skew controlling unit 260 may control the first and second delaying units 241 and 242 to delay the first delayed signal CLK_da or advance the second delayed signal CLK_db.

The above-described semiconductor device 200 may compensate for the internal skew by using the same signal without training with an external device. Therefore, the semiconductor device has improved performance and reliability.

Figure 5:
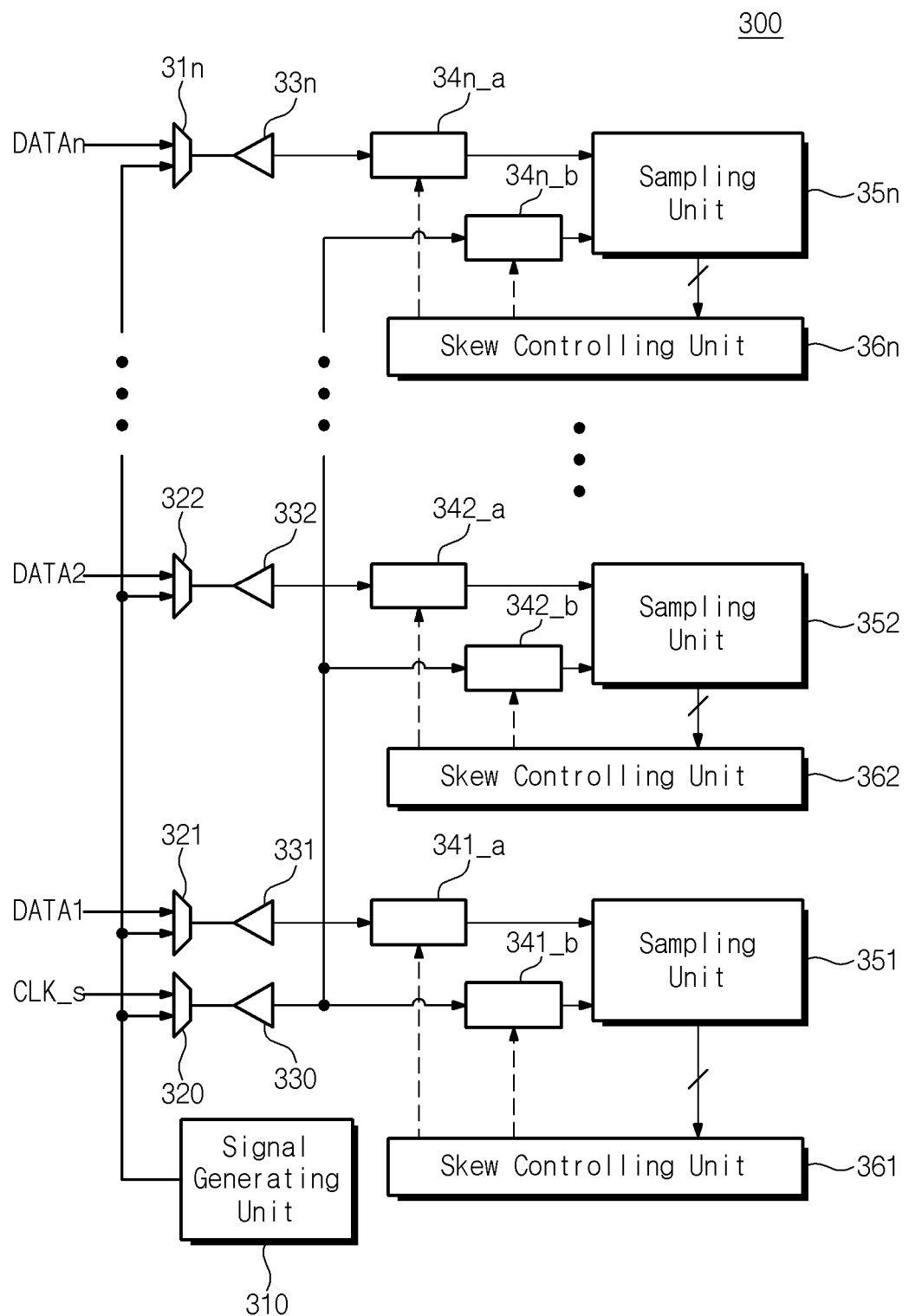
FIG. 5 is a block diagram illustrating a semiconductor device according to another exemplary embodiment.

FIG. 5 is a block diagram illustrating a semiconductor device 300 according to another exemplary embodiment of the inventive concept. Exemplarily, the semiconductor device 300 may receive data or a synchronous clock CLK_s from an external device via a plurality of channels.

Referring to FIG. 5, the semiconductor device 300 includes a signal generating unit 310, a plurality of multiplexers 320 to 32n, a clock receiving unit 330, a plurality of data receiving units 331 to 33n, a plurality of delaying units 341 to 34n, a plurality of sampling units 351 to 35n, and a plurality of skew controlling units 361 to 36n. The semiconductor device 300 may receive the data DATA1 to DATAn or synchronous clock CLK_s from the external device via the plurality of channels. For ease of description, operations of the signal generating unit 310, the multiplexers 320 and 321, the receiving units 330 and 331, the delaying units 341_a and 341_b, the sampling unit 351, and the skew controlling unit 361 corresponding to a single channel are described. However, the inventive concept is not limited thereto, and thus, the other elements may perform the same operations.

The signal generating unit 310 may generate a reference signal CLK_ref for compensating for the internal skew. The generated reference signal CLK_ref is transmitted to the multiplexers 320 and 321.

The multiplexers 320 and 321 may receive data DATA1 and the synchronous clock CLK_s from the external device via a single channel. The multiplexers 320 and 321 may receive the reference signal CLK_ref from the signal generating unit 310. The multiplexer 320 may select and output one of the synchronous clock CLK_s and the reference signal CLK_ref, and the multiplexer 321 may select and output one of the received data DATA1 and the reference signal CLK-ref. Both of the multiplexers 320 and 321 may output the reference signal CLK_ref in order to compensate for the internal skew in the semiconductor device 300.

The receiving units 330 and 331 may receive the data DATA1, the synchronous clock CLK_s, and the reference signal CLK_ref from the multiplexers 320 and 321. For example, the receiving units 330 and 331 may receive the data DATA1 and the synchronous clock CLK_s from the multiplexers 320 and 321 respectively. The receiving units 330 and 331 may receive the reference signal CLK_ref from the multiplexers 320 and 321 in order to compensate for the internal skew. The receiving units 330 and 331 may output signals in response to the received signals.

The delaying units 341_a and 341_b may delay the output signals of the receiving units 330 and 331 by a certain time to thereby generate delayed signals. The delaying units 341_a and 341_b transmit the generated delayed signals to the sampling unit 351.

The sampling unit 351 may generate sampling data based on the received delayed signals. The generated sampling data is transmitted to the skew controlling unit 361.

The skew controlling unit 361 may control the delaying units 341_a and 341_b based on the received sampling data. For example, the skew controlling unit 361 may control the delaying units 341_a and 341_b based on the skew compensating methods described above with reference to FIGS. 1 to 4.

According to an exemplary embodiment of the inventive concept, the semiconductor device 300 may receive the data and the synchronous clock from the external device via the plurality of channels. The semiconductor device 300 may generate the reference signal CLK_ref to compensate for the internal skew of components corresponding to the plurality of channels. That is, without training with the external device, the internal skew is compensated for using the reference signal CLK_ref. Therefore, the semiconductor device has improved performance and reliability.

The semiconductor device according to an embodiment of the inventive concept includes the signal generating unit for generating the reference signal. The semiconductor device may detect and compensate for the internal skew (e.g. a skew between a clock and data due to a design mismatch, a process variation, a wiring mismatch, or a device mismatch) which occurs in the semiconductor device by using the same reference signal. Therefore, the semiconductor device has improved performance and reliability without training with an external device.

The above exemplary embodiments are considered to be illustrative and not restrictive, and the appended claims are intended to cover modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
   a signal generating unit configured to generate and output a reference signal;
   a first receiving unit configured to receive the reference signal and output a first output signal;
   a second receiving unit configured to receive the reference signal and output a second output signal;
   a delay unit configured to delay the first output signal by a certain time and output a delayed signal;
   a sampling unit configured to sample the second output signal based on the delayed signal and output sampling data; and
   a skew controlling unit configured to control the delaying unit based on the sampling data.

2. The semiconductor device of claim 1, further comprising:
   first and second multiplexers configured to receive the reference signal from the signal generating unit, and receive a synchronous clock and data from an external device, respectively.

3. The semiconductor device of claim 2,
   wherein the first multiplexer is configured to transmit one of the received reference signal and synchronous clock to the first receiving unit, and
   wherein the second multiplexer is configured to transmit one of the received reference signal and data to the second receiving unit.

4. The semiconductor device of claim 1, wherein the reference signal has at least one of the same frequency, phase and duty cycle as a synchronous signal of the semiconductor device.

5. The semiconductor device of claim 1, wherein the skew controlling unit is configured to store a delay characteristic of the delaying unit based on the sampling data.

6. The semiconductor device of claim 5, wherein the skew controlling unit is configured to control the delaying unit based on the stored delay characteristic.

7. The semiconductor device of claim 1,
   wherein the sampling unit is configured to generate first sampling data by sampling the second output signal based on the first output signal and generate second sampling data by sampling the second output signal based on the delayed signal, and
   wherein the skew controlling unit is configured to compare the first and second sampling data, and control the delaying unit based on a result of the comparison.

8. The semiconductor device of claim 7, wherein, when the first and second sampling data are the same, the skew controlling unit is configured to control the delaying unit such that a delay time of the delayed signal is adjusted.

9. The semiconductor device of claim 7, wherein, when the first and second sampling data are different from each other, the skew controlling unit is configured to control the delaying unit to have a delay time characteristic of the delayed signal.

10. The semiconductor device of claim 1, wherein the sampling unit is configured to sample the second output signal a plurality of times based on the delayed signal, and output the sampling data based on an average value of results of the sampling performed the plurality of times.

11. A method for compensating for an internal skew of a semiconductor device having first and second receiving units and operating based on a synchronous clock, the method comprising:
    generating a reference signal;
    transmitting the reference signal to the first and second receiving units to generate first and second output signals;
    generating first sampling data by sampling the second output signal based on the first output signal;
    generating a delayed signal by delaying the first output signal by a delay time;
    generating second sampling data by sampling the second output signal based on the delayed signal;
    comparing the first and second sampling data; and
    determining a delay time of a delay unit according to a result of the comparing.

12. The method of claim 11,
    wherein the generating the first sampling data comprises generating the first sampling data by sampling the second output signal at at least one of a rising edge and a falling edge of the first output signal, and
    wherein the generating the second sampling data comprises generating the second sampling data by sampling the second output signal at at least one of a rising edge and a falling edge of the delayed signal.

13. The method of claim 12, wherein the determining the delay time comprises adjusting the delay time when the first and second sampling data are the same according to a result of the comparing.

14. The method of claim 12, wherein the determining the delay time comprises storing the delay time when the first and second sampling data are different from each other according to a result of the comparing.

15. The method of claim 14, further comprising controlling the delay unit based on the stored delay time.

16. A method of compensating for an internal skew of a semiconductor device operating based on a synchronous clock, the method comprising:
    generating a reference signal;
    transmitting the reference signal to a plurality of receiving units of the semiconductor device, a first receiving unit among the receiving units receiving the synchronous clock and the other receiving units receiving respective input data;
    controlling each of the receiving units to select and output the reference signal;
    comparing at least one of reference signals output from the other receiving units to a reference signal output from the first receiving unit; and
    according to a result of the comparing, controlling the at least one of the reference signals to further delay or advance in view of the reference signal output from the first receiving unit, thereby compensating for a skew between the synchronous clock and the data.

17. The method of claim 16, wherein the at least one of the reference signals is delayed by a predetermined time before the comparing.

18. The method of claim 16, wherein the comparing the at least one of the reference signals to the reference signal output from the first receiving unit is performed two or more times until a phase of the at least one of the reference signals is the same as a phase of the reference signal output from the first receiving unit.

19. The method of claim 16, wherein the compensating for the skew between the synchronous clock and the data is performed without using a training signal input from or output to a device external to the semiconductor device.

* * * * *